(12) United States Patent
Lu

(10) Patent No.: US 10,510,818 B2
(45) Date of Patent: Dec. 17, 2019

(54) ORGANIC LIGHT EMITTING DISPLAY DEVICE

(71) Applicant: SHENZHEN CHINA STAR OPTOELECTRONICS TECHNOLOGY CO., LTD., Shenzhen, Guangdong (CN)

(72) Inventor: Macai Lu, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/203,856

(22) Filed: Nov. 29, 2018

(65) Prior Publication Data

US 2019/0326370 A1 Oct. 24, 2019

Related U.S. Application Data

(63) Continuation of application No. PCT/CN2018/089411, filed on May 31, 2018.

(30) Foreign Application Priority Data

Apr. 20, 2018 (CN) .......................... 2018 1 0362278

(51) Int. Cl.
*H01L 27/32* (2006.01)
*H01L 51/52* (2006.01)
*H01L 27/12* (2006.01)

(52) U.S. Cl.
CPC ...... *H01L 27/3246* (2013.01); *H01L 27/1225* (2013.01); *H01L 27/3276* (2013.01); *H01L 51/5228* (2013.01); *H01L 51/5256* (2013.01)

(58) Field of Classification Search
None
See application file for complete search history.

(56) References Cited

U.S. PATENT DOCUMENTS

2018/0123078 A1* 5/2018 Byun .................. H01L 51/5206

* cited by examiner

*Primary Examiner* — Robert K Carpenter
(74) *Attorney, Agent, or Firm* — Leong C. Lei

(57) ABSTRACT

An OLED display device is disclosed, and the metal connection electrode is connected to the auxiliary electrode through a recessed hole; the recessed hole forms a first cavity and a second cavity communicating with each other, and the first cavity extends from an edge line of the second cavity away from the pixel electrode in the same direction; the pixel definition layer is above the array substrate, and reserved with grooves corresponding to the recessed holes and the pixel electrodes; an OLED semiconductor layer on the pixel definition layer covers on the pixel electrode and the metal connection electrode, and also extends into the first cavity to be connected with the auxiliary electrode; a cathode is on the OLED semiconductor layer, and extends into the first cavity to be connected with the auxiliary electrode, and is in a discontinuous connection state with the recessed hole as a breakpoint.

19 Claims, 3 Drawing Sheets

ORGANIC LIGHT EMITTING DISPLAY DEVICE

CROSS-REFERENCE TO RELATED APPLICATION

This application is a continuing application of PCT Patent Application No. PCT/CN2018/089411 entitled "Organic light emitting display device", filed on May 31, 2018, which claims priority to Chinese Patent Application No. 201810362778.5, filed on Apr. 20, 2018, both of which are hereby incorporated in its entireties by reference.

FIELD OF THE INVENTION

The present invention relates to a display technology field, and more particularly to an organic light emitting display device.

BACKGROUND OF THE INVENTION

Compared with the conventional LCD, the organic light emitting display device is a self-luminous display device. Since it does not require a backlight, it possesses the advantages of thinness, power saving, fast response, etc., and also possesses excellent viewing angle and contrast. In general, an organic light emitting display device comprises an array substrate and an OLED light emitting device disposed above the array substrate. The OLED light emitting device includes an anode, a hole injection layer, a hole transport layer, a light emitting layer, an electron transport layer, an electron injection layer and a cathode; wherein, the anode, the hole injection layer, the hole transport layer, the light emitting layer, the electron transport layer, and the electron injection layer are formed as an OLED semiconductor layer.

According to the light emitting direction, the organic light emitting display device includes a top emission type, a bottom emission type, and a dual emission type. In the top emission type, the organic light emitting display device emits light in the opposite direction to the array substrate provided with sub pixels, and the structure can meet the aperture ratio requirement of a large scale high-resolution OLED panel, so it is often applied to the large scale high-resolution OLED panel. However, since the cathode of the OLED light emitting device on the organic light emitting display device has a high resistivity, a severe voltage drop phenomenon occurs, and once the organic light emitting display device is electrified, non-uniformity in brightness or in image quality occurs.

As shown in FIG. 1, in order to overcome the foregoing problems, an inverted trapezoidal leg a is usually formed around the pixel electrode 1111' of the array substrate 1'. By controlling the size of the inverted trapezoidal leg a, and controlling the size of the cavity of the pixel definition layer 2' corresponding to the recessed hole 21' above the metal connection electrode 1112' of the array substrate 1' and the tilt angle formed by the cavity sidewall and the horizontal plane of the array substrate 1', the cathode 4' on the OLED semiconductor layer 3' can enter into the cavity of the recessed hole 21' above the metal connection electrode 1112', and is connected to the auxiliary electrode 122' of the array substrate 1' with the metal connection electrode 1112' to reduce the resistance of the cathode 4' for realizing the objective of reducing the voltage drop. However, the inventors have found that the pixel definition layer 2 and the inverted trapezoidal legs a of the organic light emitting display device in the foregoing method need to be developed by double exposure to form a positive inverted trapezoidal structure, which is not only complicated but also requires time and labor.

SUMMARY OF THE INVENTION

An objective of the present invention is to provide an organic light emitting display device. The inverted trapezoidal legs can be omitted to simplify the manufacturing process. Meanwhile, the conductivity of the cathode on the OLED semiconductor layer can be improved, thereby reducing the voltage drop.

For solving the aforesaid technical issue, the present invention provides an organic light emitting display device, comprising:

an array substrate, comprising a pixel electrode and a metal connection electrode and an auxiliary electrode located around the pixel electrode, wherein the metal connection electrode is electrically connected to the auxiliary electrode through a recessed hole formed in the array substrate; the recessed hole is located above the auxiliary electrode and forms a first cavity and a second cavity communicating with each other, and the first cavity extends from an edge line of the second cavity away from the pixel electrode in a direction away from the pixel electrode;

a pixel definition layer disposed on the array substrate; wherein the pixel definition layer is respectively provided with corresponding grooves above the recessed hole and the pixel electrode of the array substrate;

an organic light emitting diode (OLED) semiconductor layer disposed on the array substrate and the pixel definition layer; wherein the OLED semiconductor layer further covers the pixel electrode and the metal connection electrode and extends into the first cavity of the recessed hole to achieve electrical connection with the auxiliary electrode; and a cathode disposed on the OLED semiconductor layer; wherein the cathode further extends into the first cavity of the recessed hole to achieve electrical connection with the auxiliary electrode and is in a discontinuous connection state with the recessed hole as a breakpoint.

The array substrate is a dual gate structure thin film transistor array substrate, comprising:

a substrate;

a bottom gate and the auxiliary electrode disposed on the substrate;

a buffer layer covering on the substrate, the bottom gate and the auxiliary electrode; wherein the buffer layer is provided with a first conductive hole penetrating an upper surface of the buffer layer and connecting with the auxiliary electrode;

an active layer disposed on the buffer layer;

a gate insulating layer disposed on the active layer;

a top gate disposed on the gate insulating layer;

a middle dielectric layer covering the active layer, the gate insulating layer, the top gate and the buffer layer; wherein the middle dielectric layer is provided with a second conductive hole penetrating upper and lower surfaces of the middle dielectric layer and communicating with the first conductive hole, and is provided with a third conductive hole and a fourth conductive hole penetrating the upper surface of the middle dielectric layer and respectively connecting with the active layer;

a source, a drain and a metal connection wire in the middle dielectric layer; wherein the source is electrically connected to the active layer through the third conductive hole and the drain is electrically connected to the active layer through the fourth conductive hole; or the source is electrically connected to the active layer through the fourth conductive hole and the drain is electrically connected to the active layer through the third conductive hole; the metal connection wire is electrically connected to the auxiliary electrode through the second conductive hole and the first conductive hole in sequence;

a planarization layer covering on the source, the drain and the metal connection wire; wherein the planarization layer is provided with a fifth conductive hole penetrating an upper surface of the planarization layer and connecting with the source or the drain, and is provided with the recessed hole connecting with the metal connection wire; and the pixel electrode, disposed on the planarization layer and electrically connected to the source or the drain through the fifth conductive hole, and the metal connection electrode, electrically connected to the auxiliary electrode after connecting with the metal connection wire through the recessed hole;

wherein both the OLED semiconductor layer and the cathode are electrically connected with the auxiliary electrode after connecting with the metal connection wire through the recessed hole.

The planarization layer is a single-layer structure made of an organic material; wherein the fifth conductive hole, and the first cavity and the second cavity of the recessed hole are all disposed in the planarization layer of the single-layer structure; or the planarization layer is a laminated layer structure formed by laminating an inorganic passivation layer made of an inorganic material and an organic planarization layer made of an organic material; wherein the fifth conductive hole penetrates upper and lower surfaces of the organic planarization layer and penetrates into the inorganic passivation layer, and the first cavity of the recessed hole is disposed in the inorganic passivation layer, and the second cavity of the recessed hole is in the organic planarization layer on the inorganic passivation layer.

The inorganic material is one of SiOx, SiNx and SiNO; the organic material is polymethyl methacrylate (PMMA) or siloxane.

The buffer layer is a single-layer structure made of one of SiOx, SiNx and SiNO; or a laminated structure made of SiNx/SiOx.

The active layer is made of indium gallium zinc oxide (IGZO) or low temperature polysilicon (LTPS).

Both the pixel electrode and the auxiliary electrode is made of one of metal oxides of ITO/Ag/ITO, IZO (indium zinc oxide)/Ag/IZO and AZO (aluminum zinc oxide)/Ag/AZO.

Correspondingly, the present invention further provides another organic light emitting display device, comprising:

an array substrate, comprising a pixel electrode and a metal connection electrode and an auxiliary electrode located around the pixel electrode, wherein the metal connection electrode is electrically connected to the auxiliary electrode through a recessed hole formed in the array substrate; the recessed hole is located above the auxiliary electrode and forms a first cavity and a second cavity communicating with each other, and the first cavity extends from an edge line of the second cavity away from the pixel electrode in a direction away from the pixel electrode;

a pixel definition layer disposed on the array substrate; wherein the pixel definition layer is respectively provided with corresponding grooves above the recessed hole and the pixel electrode of the array substrate;

an organic light emitting diode (OLED) semiconductor layer disposed on the array substrate and the pixel definition layer; wherein the OLED semiconductor layer further covers the pixel electrode and the metal connection electrode and extends into the first cavity of the recessed hole to achieve electrical connection with the auxiliary electrode; and a cathode disposed on the OLED semiconductor layer; wherein the cathode further extends into the first cavity of the recessed hole to achieve electrical connection with the auxiliary electrode and is in a discontinuous connection state with the recessed hole as a breakpoint;

wherein the array substrate is a top gate structure thin film transistor array substrate, comprising:

a substrate;

a light blocking layer and the auxiliary electrode disposed on the substrate;

a buffer layer covering on the substrate, the light blocking layer and the auxiliary electrode; wherein the buffer layer is provided with a first conductive hole penetrating an upper surface of the buffer layer and connecting with the auxiliary electrode;

an active layer disposed on the buffer layer;

a gate insulating layer disposed on the active layer;

a top gate disposed on the gate insulating layer;

a middle dielectric layer covering the active layer, the gate insulating layer, the top gate and the buffer layer; wherein the middle dielectric layer is provided with a second conductive hole penetrating upper and lower surfaces of the middle dielectric layer and communicating with the first conductive hole, and is provided with a third conductive hole and a fourth conductive hole penetrating the upper surface of the middle dielectric layer and respectively connecting with the active layer;

a source, a drain and a metal connection wire in the middle dielectric layer; wherein the source is electrically connected to the active layer through the third conductive hole and the drain is electrically connected to the active layer through the fourth conductive hole; or the source is electrically connected to the active layer through the fourth conductive hole and the drain is electrically connected to the active layer through the third conductive hole; the metal connection wire is electrically connected to the auxiliary electrode through the second conductive hole and the first conductive hole in sequence;

a planarization layer covering on the source, the drain and the metal connection wire; wherein the planarization layer is provided with a fifth conductive hole penetrating an upper surface of the planarization layer and connecting with the source or the drain, and is provided with the recessed hole connecting with the metal connection wire; and the pixel electrode, disposed on the planarization layer and electrically connected to the source or the drain through the fifth conductive hole, and the metal connection electrode, electrically connected to the auxiliary electrode after connecting with the metal connection wire through the recessed hole;

wherein both the OLED semiconductor layer and the cathode are electrically connected with the auxiliary electrode after connecting with the metal connection wire through the recessed hole.

The planarization layer is a single-layer structure made of an organic material; wherein the fifth conductive hole, and the first cavity and the second cavity of the recessed hole are all disposed in the planarization layer of the single-layer structure; or the planarization layer is a laminated layer structure formed by laminating an inorganic passivation layer made of an inorganic material and an organic planarization layer made of an organic material; wherein the fifth conductive hole penetrates upper and lower surfaces of the organic planarization layer and penetrates into the inorganic passivation layer, and the first cavity of the recessed hole is disposed in the inorganic passivation layer, and the second cavity of the recessed hole is in the organic planarization layer on the inorganic passivation layer.

The inorganic material is one of SiOx, SiNx and SiNO; the organic material is polymethyl methacrylate (PMMA) or siloxane.

The buffer layer is a single-layer structure made of one of SiOx, SiNx and SiNO; or a laminated structure made of SiNx/SiOx.

The active layer is made of indium gallium zinc oxide (IGZO) or low temperature polysilicon (LIPS).

Both the pixel electrode and the auxiliary electrode is made of one of metal oxides of ITO/Ag/ITO, IZO (indium zinc oxide)/Ag/IZO and AZO (aluminum zinc oxide)/Ag/AZO.

Correspondingly, the present invention further provides one another organic light emitting display device, comprising:

an array substrate, comprising a pixel electrode and a metal connection electrode and an auxiliary electrode located around the pixel electrode, wherein the metal connection electrode is electrically connected to the auxiliary electrode through a recessed hole formed in the array substrate; the recessed hole is located above the auxiliary electrode and forms a first cavity and a second cavity communicating with each other, and the first cavity extends from an edge line of the second cavity away from the pixel electrode in a direction away from the pixel electrode;

a pixel definition layer disposed on the array substrate; wherein the pixel definition layer is respectively provided with corresponding grooves above the recessed hole and the pixel electrode of the array substrate;

an organic light emitting diode (OLED) semiconductor layer disposed on the array substrate and the pixel definition layer; wherein the OLED semiconductor layer further covers the pixel electrode and the metal connection electrode and extends into the first cavity of the recessed hole to achieve electrical connection with the auxiliary electrode; and a cathode disposed on the OLED semiconductor layer; wherein the cathode further extends into the first cavity of the recessed hole to achieve electrical connection with the auxiliary electrode and is in a discontinuous connection state with the recessed hole as a breakpoint;

wherein the array substrate is a bottom gate structure thin film transistor array substrate, comprising:

a substrate;

a bottom gate and the auxiliary electrode disposed on the substrate;

a buffer layer covering on the substrate, the bottom gate and the auxiliary electrode; wherein the buffer layer is provided with a first conductive hole penetrating an upper surface of the buffer layer and connecting with the auxiliary electrode;

an active layer disposed on the buffer layer;

a middle dielectric layer covering the active layer and the buffer layer; wherein the middle dielectric layer is provided with a second conductive hole penetrating upper and lower surfaces of the middle dielectric layer and communicating with the first conductive hole, and is provided with a third conductive hole and a fourth conductive hole penetrating the upper surface of the middle dielectric layer and respectively connecting with the active layer;

a source, a drain and a metal connection wire in the middle dielectric layer; wherein the source is electrically connected to the active layer through the third conductive hole and the drain is electrically connected to the active layer through the fourth conductive hole; or the source is electrically connected to the active layer through the fourth conductive hole and the drain is electrically connected to the active layer through the third conductive hole; the metal connection wire is electrically connected to the auxiliary electrode through the second conductive hole and the first conductive hole in sequence;

a planarization layer covering on the source, the drain and the metal connection wire; wherein the planarization layer is provided with a fifth conductive hole penetrating an upper surface of the planarization layer and connecting with the source or the drain, and is provided with the recessed hole connecting with the metal connection wire; and the pixel electrode, disposed on the planarization layer and electrically connected to the source or the drain through the fifth conductive hole, and the metal connection electrode, electrically connected to the auxiliary electrode after connecting with the metal connection wire through the recessed hole;

wherein both the OLED semiconductor layer and the cathode are electrically connected with the auxiliary electrode after connecting with the metal connection wire through the recessed hole.

The planarization layer is a single-layer structure made of an organic material; wherein the fifth conductive hole, and the first cavity and the second cavity of the recessed hole are all disposed in the planarization layer of the single-layer structure; or the planarization layer is a laminated layer structure formed by laminating an inorganic passivation layer made of an inorganic material and an organic planarization layer made of an organic material; wherein the fifth conductive hole penetrates upper and lower surfaces of the organic planarization layer and penetrates into the inorganic passivation layer, and the first cavity of the recessed hole is disposed in the inorganic passivation layer, and the second cavity of the recessed hole is in the organic planarization layer on the inorganic passivation layer.

The inorganic material is one of SiOx, SiNx and SiNO; the organic material is polymethyl methacrylate (PMMA) or siloxane.

The buffer layer is a single-layer structure made of one of SiOx, SiNx and SiNO; or a laminated structure made of SiNx/SiOx.

The active layer is made of indium gallium zinc oxide (IGZO) or low temperature polysilicon (LTPS).

Both the pixel electrode and the auxiliary electrode is made of one of metal oxides of ITO/Ag/ITO, IZO (indium zinc oxide)/Ag/IZO and AZO (aluminum zinc oxide)/Ag/AZO.

The embodiments of the present invention possess the following benefits: in the present invention, the cathode on the OLED semiconductor layer is made into a discontinuous connection state with the recessed hole formed in the array substrate, then, the resistance of the cathode is effectively reduced, and the cathode can be extended into the recessed hole to achieve the electrical connection with the auxiliary electrode. The conductivity of the cathode on the OLED semiconductor layer can be improved, and the purpose of reducing the voltage drop can be achieved. Meanwhile, the inverted trapezoidal legs in the prior art can be omitted to simplify the manufacturing process for saving time and effort.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

In order to make the objectives, technical solutions, and advantages of the embodiments of the disclosure more apparent, the present invention will be described below in detail with reference to the drawings.

Figure 1:
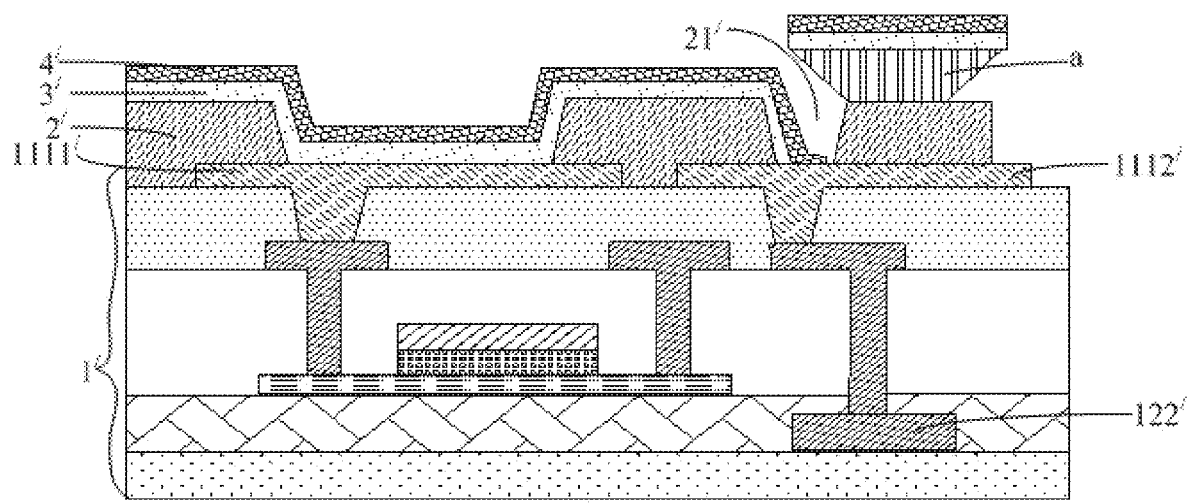
FIG. 1 is a sectional view diagram of an organic light emitting display device in the prior art.
Figure 2:
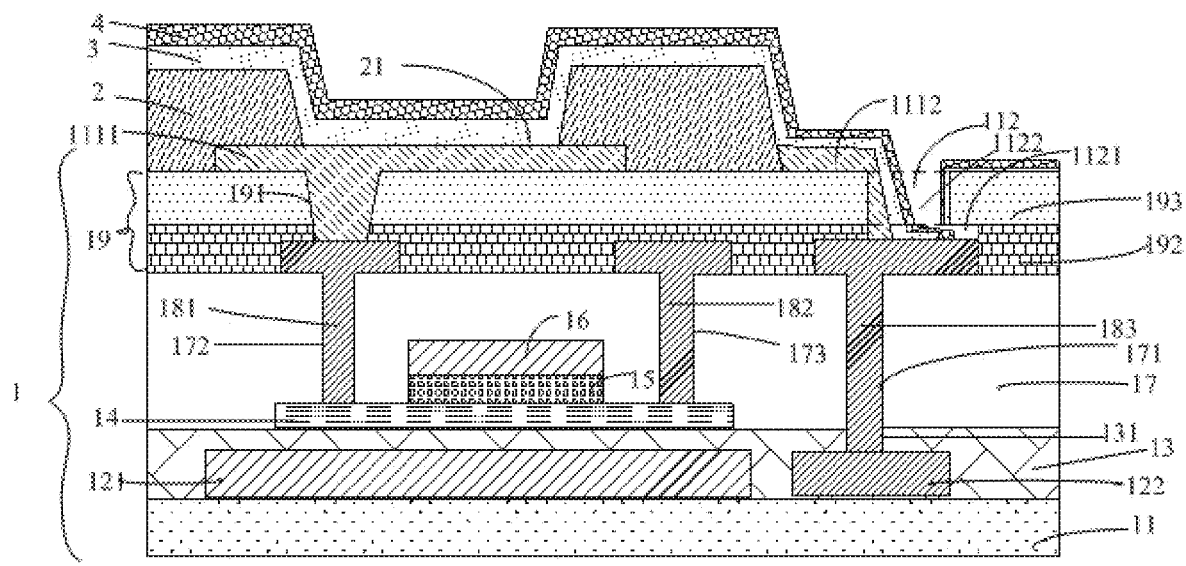
FIG. 2 is a sectional view diagram of an organic light emitting display device according to the first embodiment of the present invention.

As shown in FIG. 2, which is the first embodiment of the present invention, an organic light emitting diode display device is provided. An array substrate in the organic light emitting diode display device is a dual gate structure thin film transistor array substrate. The device specifically comprises:

an array substrate 1, comprising a pixel electrode 1111 and a metal connection electrode 122 and an auxiliary electrode 122 located around the pixel electrode 1111, wherein the metal connection electrode 1112 is electrically connected to the auxiliary electrode 122 through a recessed hole 112 formed in the array substrate 1; the recessed hole 112 is located above the auxiliary electrode 122 and forms a first cavity 1121 and a second cavity 1122 communicating with each other, and the first cavity 112 extends from an edge line of the second cavity 1122 away from the pixel electrode 1111 in a direction away from the pixel electrode 1111, thus, by expanding the cavity size of the recessed hole 112 in the horizontal length direction of the array substrate 1, the metal connection electrode 1112 and other conductive substances can be more favorably introduced into the recessed hole 112;

a pixel definition layer 2 disposed on the array substrate 1; wherein the pixel definition layer 2 is respectively provided with corresponding grooves 21 above the recessed hole 112 and the pixel electrode 1111 of the array substrate 1, such that the pixel electrode 1111 and the metal connection electrode 1112 are accommodated in the grooves 21 corresponding to the pixel definition layer 2 to prevent the OLED light emitting device from being unable to connect with the pixel electrode 1111 and the metal connection electrode 1112 and then to affect the normal light emission of the OLED light emitting device;

an organic light emitting diode (OLED) semiconductor layer 3 disposed on the array substrate 1 and the pixel definition layer 2; wherein the OLED semiconductor layer 3 further covers the pixel electrode 1111 and the metal connection electrode 1112 and extends into the first cavity 1121 of the recessed hole 112 to achieve electrical connection with the auxiliary electrode 122; and a cathode 4 disposed on the OLED semiconductor layer 3; wherein the cathode 4 further extends into the first cavity 1121 of the recessed hole 112 to achieve electrical connection with the auxiliary electrode 122 and is in a discontinuous connection state with the recessed hole 112 as a breakpoint, such that the length of the cathode 4 is decreased to reduce the resistance of the cathode 4.

Significantly, since the cavity diameter of the second cavity 1122 is smaller than the cavity diameter of the first cavity 1121 in the recessed hole 112, and edge line of the second cavity 1122 away from the pixel electrode 1111 is located above the first cavity 1121, such that the cross-section of the recessed hole 112 may be in a structure of "L" or "⊥" type. As long as the requirement that the metal connection electrode 1112, the OLED semiconductor layer 3 and the cathode 4 can be electrically connected to the auxiliary electrode 1112 is satisfied, the purpose of improving the conductivity of the cathode 4 on the OLED semiconductor layer 3 can be achieved. Meanwhile, since the cathode 4 is in a discontinuous connection state with the recessed hole 112 as a breakpoint, the entire length of the cathode 4 is reduced, thereby reducing the resistance of the cathode 4.

Significantly, the auxiliary electrode 1112 may be formed by cascading multiple metal layers, or may be formed by a single metal layer, and regardless of which layer is disposed above the array substrate 1, as long as the recessed hole 112 can connecting with the auxiliary electrode 1112, the metal connection electrode 1112 can be electrically connected with the auxiliary electrode 122 through the recessed hole 112 disposed on the array substrate 1.

Specifically, the OLED semiconductor layer 3 generally comprises an anode, a hole injection layer, a hole transporting layer, a light emitting material layer, an electron transport layer and an electron injection layer. The cathode 4 corresponds to the OLED semiconductor layer 3.

In the first embodiment of the present invention, the auxiliary electrode 122 in the dual gate structure thin film transistor array substrate of the organic light emitting display device has a multi-stage connection structure. The dual gate structure thin film transistor array substrate specifically comprises:

a substrate 11, which may be a glass substrate or a plastic substrate;

a bottom gate 121 and the auxiliary electrode 122 disposed on the substrate 11, wherein the auxiliary electrode 122 is disposed on the penultimate layer;

a buffer layer 13 covering on the substrate 11, the bottom gate 121 and the auxiliary electrode 122; wherein the buffer layer 13 is provided with a first conductive hole 131 penetrating an upper surface of the buffer layer 13 and connecting with the auxiliary electrode 122, wherein the buffer layer 13 is a single-layer structure made of one of SiOx, SiNx and SiNO; or a laminated structure made of SiNx/SiOx;

an active layer 14 disposed on the buffer layer 13, wherein the active layer 14 is made of indium gallium zinc oxide (IGZO) or low temperature polysilicon (LTPS);

a gate insulating layer 15 disposed on the active layer 14, wherein the gate insulating layer 15 is made of an inorganic material, and the inorganic material is one of SiOx, SiNx and SiNO;

a top gate 16 disposed on the gate insulating layer 15;

a middle dielectric layer 17 covering the active layer 14, the gate insulating layer 15, the top gate 16 and the buffer layer 13; wherein the middle dielectric layer 17 is provided with a second conductive hole 171 penetrating upper and lower surfaces of the middle dielectric layer 17 and communicating with the first conductive hole 131, and is provided with a third conductive hole 172 and a fourth conductive hole 173 penetrating the upper surface of the middle dielectric layer 17 and respectively connecting with the active layer 1; the middle dielectric layer 17 is made of an inorganic material, and the inorganic material is one of SiOx, SiNx and SiNO;

a source 181, a drain 182 and a metal connection wire 183 in the middle dielectric layer 17; wherein the source 181 is electrically connected to the active layer 14 through the third conductive hole 172 and the drain 182 is electrically connected to the active layer 14 through the fourth conductive hole 173; or the source 181 is electrically connected to the active layer 14 through the fourth conductive hole 173 and the drain 182 is electrically connected to the active layer 14 through the third conductive hole 172; the metal connection wire 183 is electrically connected to the auxiliary electrode 122 through the second conductive hole 171 and the first conductive hole 131 in sequence, wherein the metal connection electrode 1112, the OLED semiconductor layer 3 and the cathode 4 can be electrically connected to the auxiliary electrode 1112 as long as having connection with the metal connection line 183;

a planarization layer 19 covering on the source 181, the drain 182 and the metal connection wire 183; wherein the planarization layer 19 is provided with a fifth conductive hole 191 penetrating an upper surface of the planarization layer 19 and connecting with the source 181 or the drain 182, and is provided with the recessed hole 112 connecting with the metal connection wire 183; and the pixel electrode 1111, disposed on the planarization layer 19 and electrically connected to the source 181 or the drain 182 through the fifth conductive hole 191, and the metal connection electrode 1112, electrically connected to the auxiliary electrode 122 after connecting with the metal connection wire 183 through the recessed hole 112;

wherein both the OLED semiconductor layer 3 and the cathode 4 are electrically connected with the auxiliary electrode 122 after connecting with the metal connection wire 183 through the recessed hole 112.

In the first embodiment of the present invention, the pixel electrode 1111 and the auxiliary electrode 1112 may be formed of a single-layer structure of a conductive metal oxide, or may be a laminated structure of metal and metal oxide. In one embodiment, both the pixel electrode 1111 and the auxiliary electrode 1112 have the single-layer structure, including but not limited to ITO or IZO. In another embodiment, both the pixel electrode 1111 and the auxiliary electrode 1112 have the laminated structure made of one of metal oxides of ITO/Ag/ITO, IZO/Ag/IZO and AZO/Ag/AZO.

In the first embodiment of the present invention, the planarization layer 19 may be a single-layer structure or a laminated structure. In the planarization layer 19 of the single-layer structure, the planarization layer 19 is made of an organic material, and then, the fifth conductive hole 191, the first cavity 1121 and the second cavity 1122 of the recessed hole 112 are all disposed in the planarization layer 19 of the single-layer structure; in the planarization layer 19 of the laminated structure, the planarization layer 19 is formed by laminating an inorganic passivation layer 192 made of an inorganic material and an organic planarization layer 193 made of an organic material; then, the fifth conductive hole 191 penetrates upper and lower surfaces of the organic planarization layer 193 and penetrates into the inorganic passivation layer 192, and the first cavity 1121 of the recessed hole 112 is disposed in the inorganic passivation layer 192, and the second cavity 1122 of the recessed hole 112 is in the organic planarization layer 193 on the inorganic passivation layer 192 (as shown in FIG. 2). The inorganic material is one of SiOx, SiNx and SiNO; the organic material includes but not limited to polymethyl methacrylate (PMMA) or siloxane.

Figure 3:
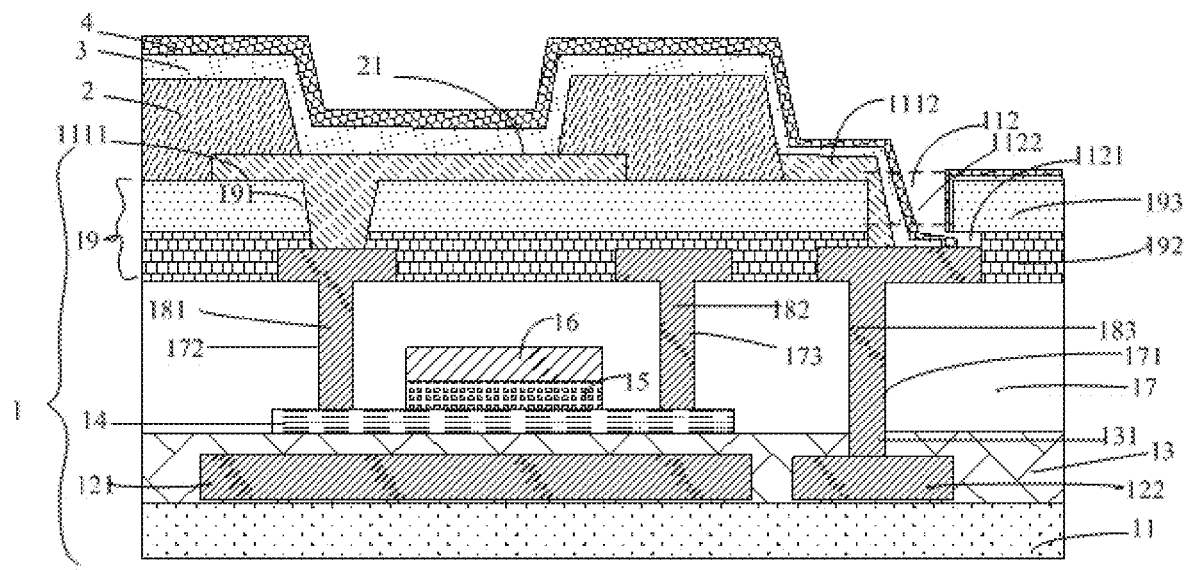
FIG. 3 is a sectional view diagram of another organic light emitting display device according to the second embodiment of the present invention.

As shown in FIG. 3, which is the second embodiment of the present invention, another organic light emitting diode display device is provided. An array substrate in the organic light emitting diode display device is a top gate structure thin film transistor array substrate. The device specifically comprises:

an array substrate 1, comprising a pixel electrode 1111 and a metal connection electrode 122 and an auxiliary electrode 122 located around the pixel electrode 1111, wherein the metal connection electrode 1112 is electrically connected to the auxiliary electrode 122 through a recessed hole 112 formed in the array substrate 1; the recessed hole 112 is located above the auxiliary electrode 122 and forms a first cavity 1121 and a second cavity 1122 communicating with each other, and the first cavity 112 extends from an edge line of the second cavity 1122 away from the pixel electrode 1111 in a direction away from the pixel electrode 1111, thus, by expanding the cavity size of the recessed hole 112 in the horizontal length direction of the array substrate 1, the metal connection electrode 1112 and other conductive substances can be more favorably introduced into the recessed hole 112;

a pixel definition layer 2 disposed on the array substrate 1; wherein the pixel definition layer 2 is respectively provided with corresponding grooves 21 above the recessed hole 112 and the pixel electrode 1111 of the array substrate 1, such that the pixel electrode 1111 and the metal connection electrode 1112 are accommodated in the grooves 21 corresponding to the pixel definition layer 2 to prevent the OLED light emitting device from being unable to connect with the pixel electrode 1111 and the metal connection electrode 1112 and then to affect the normal light emission of the OLED light emitting device;

an organic light emitting diode (OLED) semiconductor layer 3 disposed on the array substrate 1 and the pixel definition layer 2; wherein the OLED semiconductor layer 3 further covers the pixel electrode 1111 and the metal connection electrode 1112 and extends into the first cavity 1121 of the recessed hole 112 to achieve electrical connection with the auxiliary electrode 122; and a cathode 4 disposed on the OLED semiconductor layer 3; wherein the cathode 4 further extends into the first cavity 1121 of the recessed hole 112 to achieve electrical connection with the auxiliary electrode 122 and is in a discontinuous connection state with the recessed hole 112 as a breakpoint, such that the length of the cathode 4 is decreased to reduce the resistance of the cathode 4.

Significantly, since the cavity diameter of the second cavity 1122 is smaller than the cavity diameter of the first cavity 1121 in the recessed hole 112, and edge line of the second cavity 1122 away from the pixel electrode 1111 is located above the first cavity 1121, such that the cross-section of the recessed hole 112 may be in a structure of "L" or "⊥" type. As long as the requirement that the metal connection electrode 1112, the OLED semiconductor layer 3 and the cathode 4 can be electrically connected to the auxiliary electrode 1112 is satisfied, the purpose of improving the conductivity of the cathode 4 on the OLED semiconductor layer 3 can be achieved. Meanwhile, since the cathode 4 is in a discontinuous connection state with the recessed hole 112 as a breakpoint, the entire length of the cathode 4 is reduced, thereby reducing the resistance of the cathode 4.

Significantly, the auxiliary electrode 1112 may be formed by cascading multiple metal layers, or may be formed by a single metal layer, and regardless of which layer is disposed above the array substrate 1, as long as the recessed hole 112 can connecting with the auxiliary electrode 1112, the metal connection electrode 1112 can be electrically connected with the auxiliary electrode 122 through the recessed hole 112 disposed on the array substrate 1.

Specifically, the OLED semiconductor layer 3 generally comprises an anode, a hole injection layer, a hole transporting layer, a light emitting material layer, an electron transport layer and an electron injection layer. The cathode 4 corresponds to the OLED semiconductor layer 3.

Corresponding to the dual gate structure thin film transistor array substrate in the first embodiment of the present invention, the difference of the top gate structure thin film transistor array substrate in the second embodiment of the present invention from the dual gate structure thin film transistor array substrate in the first embodiment of the present invention is: the bottom gate 121 of the dual gate structure thin film transistor array substrate in the first embodiment of the present invention is configured as a light blocking layer 121, and other components in the second embodiment have the same structure and connection relationship as the dual gate structure thin film transistor array substrate in the first embodiment of the present invention. For details, reference may be made to relevant parts of the dual gate thin film transistor array substrate in the first embodiment of the present invention, which will not be further described herein.

Correspondingly, the planarization layer 19 of the top gate structure thin film transistor array substrate may be a single-layer structure or a laminated structure. In the planarization layer 19 of the single-layer structure, the planarization layer 19 is made of an organic material, and then, the fifth conductive hole 191, the first cavity 1121 and the second cavity 1122 of the recessed hole 112 are all disposed in the planarization layer 19 of the single-layer structure; in the planarization layer 19 of the laminated structure, the planarization layer 19 is formed by laminating an inorganic passivation layer 192 made of an inorganic material and an organic planarization layer 193 made of an organic material; then, the fifth conductive hole 191 penetrates upper and lower surfaces of the organic planarization layer 193 and penetrates into the inorganic passivation layer 192, and the first cavity 1121 of the recessed hole 112 is disposed in the inorganic passivation layer 192, and the second cavity 1122 of the recessed hole 112 is in the organic planarization layer 193 on the inorganic passivation layer 192 (as shown in FIG. 3). The inorganic material is one of SiOx, SiNx and SiNO; the organic material includes but not limited to polymethyl methacrylate (PMMA) or siloxane.

Figure 4:
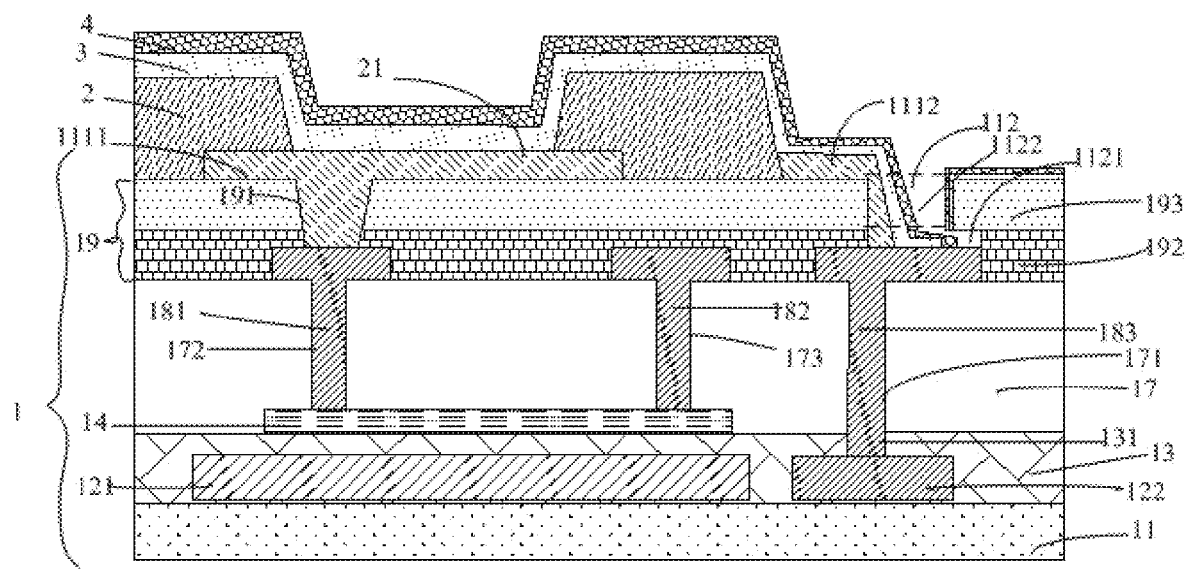
FIG. 4 is a sectional view diagram of one another organic light emitting display device according to the third embodiment of the present invention.

As shown in FIG. 4, which is the third embodiment of the present invention, one another organic light emitting diode display device is provided. An array substrate in the organic light emitting diode display device is a bottom gate structure thin film transistor array substrate. The device specifically comprises:

an array substrate 1, comprising a pixel electrode 1111 and a metal connection electrode 122 and an auxiliary electrode 122 located around the pixel electrode 1111, wherein the metal connection electrode 1112 is electrically connected to the auxiliary electrode 122 through a recessed hole 112 formed in the array substrate 1; the recessed hole 112 is located above the auxiliary electrode 122 and forms a first cavity 1121 and a second cavity 1122 communicating with each other, and the first cavity 112 extends from an edge line of the second cavity 1122 away from the pixel electrode 1111 in a direction away from the pixel electrode 1111, thus, by expanding the cavity size of the recessed hole 112 in the horizontal length direction of the array substrate 1, the metal connection electrode 1112 and other conductive substances can be more favorably introduced into the recessed hole 112;

a pixel definition layer 2 disposed on the array substrate 1; wherein the pixel definition layer 2 is respectively provided with corresponding grooves 21 above the recessed hole 112 and the pixel electrode 1111 of the array substrate 1, such that the pixel electrode 1111 and the metal connection electrode 1112 are accommodated in the grooves 21 corresponding to the pixel definition layer 2 to prevent the OLED light emitting device from being unable to connect with the pixel electrode 1111 and the metal connection electrode 1112 and then to affect the normal light emission of the OLED light emitting device;

an organic light emitting diode (OLED) semiconductor layer 3 disposed on the array substrate 1 and the pixel definition layer 2; wherein the OLED semiconductor layer 3 further covers the pixel electrode 1111 and the metal connection electrode 1112 and extends into the first cavity 1121 of the recessed hole 112 to achieve electrical connection with the auxiliary electrode 122; and a cathode 4 disposed on the OLED semiconductor layer 3; wherein the cathode 4 further extends into the first cavity 1121 of the recessed hole 112 to achieve electrical connection with the auxiliary electrode 122 and is in a discontinuous connection state with the recessed hole 112 as a breakpoint, such that the length of the cathode 4 is decreased to reduce the resistance of the cathode 4.

Significantly, since the cavity diameter of the second cavity 1122 is smaller than the cavity diameter of the first cavity 1121 in the recessed hole 112, and edge line of the second cavity 1122 away from the pixel electrode 1111 is located above the first cavity 1121, such that the cross-section of the recessed hole 112 may be in a structure of "L" or "⊥" type. As long as the requirement that the metal connection electrode 1112, the OLED semiconductor layer 3 and the cathode 4 can be electrically connected to the auxiliary electrode 1112 is satisfied, the purpose of improving the conductivity of the cathode 4 on the OLED semiconductor layer 3 can be achieved. Meanwhile, since the cathode 4 is in a discontinuous connection state with the recessed hole 112 as a breakpoint, the entire length of the cathode 4 is reduced, thereby reducing the resistance of the cathode 4.

Significantly, the auxiliary electrode 1112 may be formed by cascading multiple metal layers, or may be formed by a single metal layer, and regardless of which layer is disposed above the array substrate 1, as long as the recessed hole 112 can connecting with the auxiliary electrode 1112, the metal connection electrode 1112 can be electrically connected with the auxiliary electrode 122 through the recessed hole 112 disposed on the array substrate 1.

Specifically, the OLED semiconductor layer 3 generally comprises an anode, a hole injection layer, a hole transporting layer, a light emitting material layer, an electron transport layer and an electron injection layer. The cathode 4 corresponds to the OLED semiconductor layer 3.

Corresponding to the dual gate structure thin film transistor array substrate in the first embodiment of the present invention, the difference of the bottom gate structure thin film transistor array substrate in the third embodiment of the present invention from the dual gate structure thin film transistor array substrate in the first embodiment of the present invention is: the gate insulating layer 15 and the top gate 16 of the dual gate structure thin film transistor array substrate in the first embodiment of the present invention are eliminated, and other components in the second embodiment have the same structure and connection relationship as the dual gate structure thin film transistor array substrate in the first embodiment of the present invention. For details, reference may be made to relevant parts of the dual gate thin film transistor array substrate in the first embodiment of the present invention, which will not be further described herein.

Correspondingly, the planarization layer 19 of the bottom gate structure thin film transistor array substrate may be a single-layer structure or a laminated structure. In the planarization layer 19 of the single-layer structure, the planarization layer 19 is made of an organic material, and then, the fifth conductive hole 191, the first cavity 1121 and the second cavity 1122 of the recessed hole 112 are all disposed in the planarization layer 19 of the single-layer structure; in the planarization layer 19 of the laminated structure, the planarization layer 19 is formed by laminating an inorganic passivation layer 192 made of an inorganic material and an organic planarization layer 193 made of an organic material; then, the fifth conductive hole 191 penetrates upper and lower surfaces of the organic planarization layer 193 and penetrates into the inorganic passivation layer 192, and the first cavity 1121 of the recessed hole 112 is disposed in the inorganic passivation layer 192, and the second cavity 1122 of the recessed hole 112 is in the organic planarization layer 193 on the inorganic passivation layer 192 (as shown in FIG. 4). The inorganic material is one of SiOx, SiNx and SiNO; the organic material includes but not limited to polymethyl methacrylate (PMMA) or siloxane.

Figure 5:
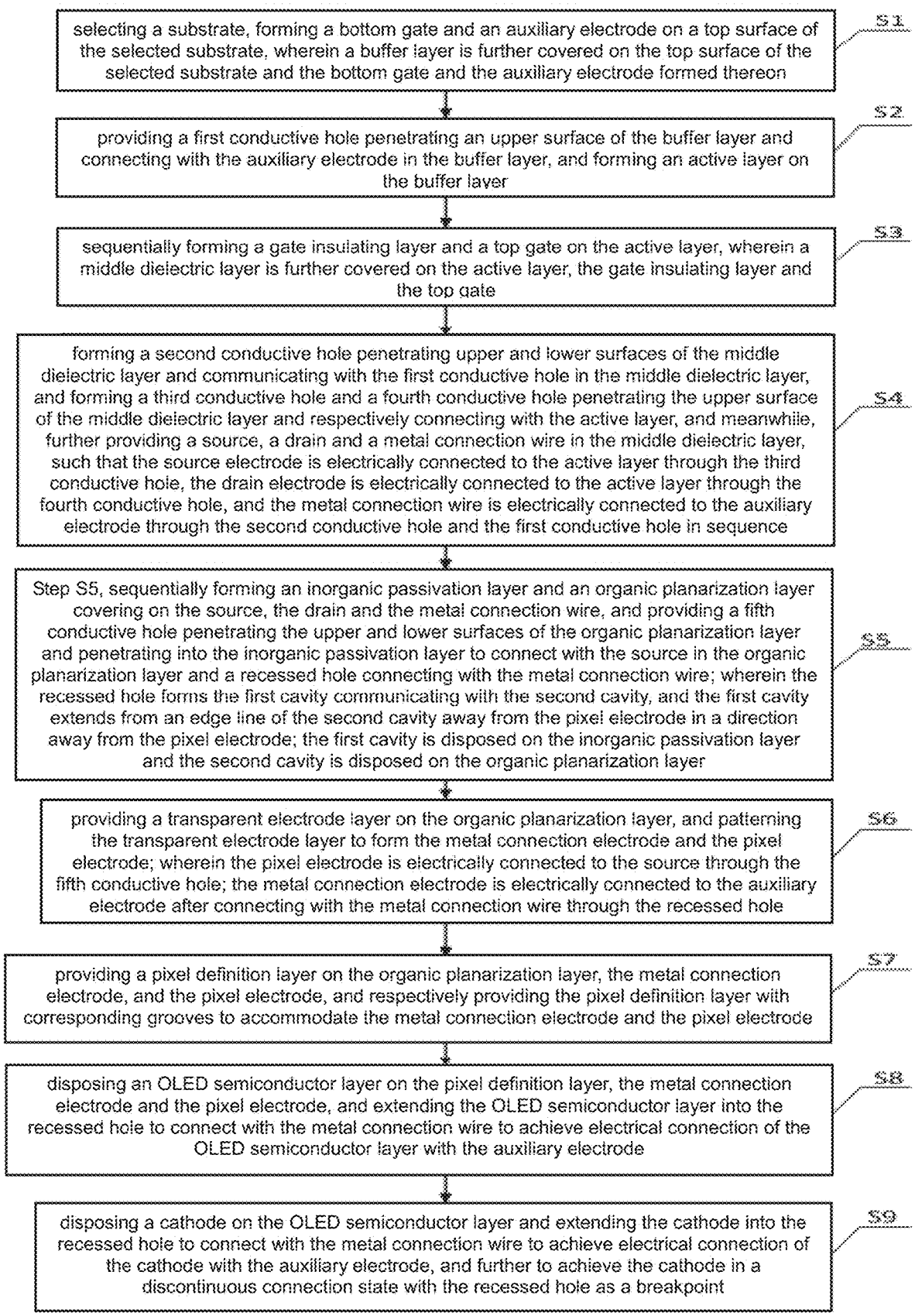
FIG. 5 is a flowchart of a manufacturing method of an organic light emitting display device according to the first embodiment of the present invention.

As shown in FIG. 5, the manufacturing method of the organic light emitting display device provided in the first embodiment of the present invention is described in detail. The method shows a manufacturing process of an organic light emitting display device including a dual gate thin film transistor array substrate, which specifically comprises steps of:

Step S1, selecting a substrate, forming a bottom gate and an auxiliary electrode on a top surface of the selected substrate, wherein a buffer layer is further covered on the top surface of the selected substrate and the bottom gate and the auxiliary electrode formed thereon;

Step S2, providing a first conductive hole penetrating an upper surface of the buffer layer and connecting with the auxiliary electrode in the buffer layer, and forming an active layer on the buffer layer;

Step S3, sequentially forming a gate insulating layer and a top gate on the active layer, wherein a middle dielectric layer is further covered on the active layer, the gate insulating layer and the top gate;

Step S4, forming a second conductive hole penetrating upper and lower surfaces of the middle dielectric layer and communicating with the first conductive hole in the middle dielectric layer, and forming a third conductive hole and a fourth conductive hole penetrating the upper surface of the middle dielectric layer and respectively connecting with the active layer, and meanwhile, further providing a source, a drain and a metal connection wire in the middle dielectric layer, such that the source electrode is electrically connected to the active layer through the third conductive hole, the drain electrode is electrically connected to the active layer through the fourth conductive hole, and the metal connection wire is electrically connected to the auxiliary electrode through the second conductive hole and the first conductive hole in sequence;

Step S5, sequentially forming an inorganic passivation layer and an organic planarization layer covering on the source, the drain and the metal connection wire, and providing a fifth conductive hole penetrating the upper and lower surfaces of the organic planarization layer and penetrating into the inorganic passivation layer to connect with the source in the organic planarization layer and a recessed hole connecting with the metal connection wire; wherein the recessed hole forms the first cavity communicating with the second cavity, and the first cavity extends from an edge line of the second cavity away from the pixel electrode in a direction away from the pixel electrode; the first cavity is disposed on the inorganic passivation layer and the second cavity is disposed on the organic planarization layer;

Step S6, providing a transparent electrode layer on the organic planarization layer, and patterning the transparent electrode layer to form the metal connection electrode and the pixel electrode; wherein the pixel electrode is electrically connected to the source through the fifth conductive hole; the metal connection electrode is electrically connected to the auxiliary electrode after connecting with the metal connection wire through the recessed hole;

Step S7: providing a pixel definition layer on the organic planarization layer, the metal connection electrode, and the pixel electrode, and respectively providing the pixel definition layer with corresponding grooves to accommodate the metal connection electrode and the pixel electrode;

Step S8, disposing an OLED semiconductor layer on the pixel definition layer, the metal connection electrode and the pixel electrode, and extending the OLED semiconductor layer into the recessed hole to connect with the metal connection wire to achieve electrical connection of the OLED semiconductor layer with the auxiliary electrode;

Step S9, disposing a cathode on the OLED semiconductor layer and extending the cathode into the recessed hole to connect with the metal connection wire to achieve electrical connection of the cathode with the auxiliary electrode, and further to achieve the cathode in a discontinuous connection state with the recessed hole as a breakpoint.

Specifically, in step S1, a first metal layer is formed by sputtering a layer of metal on the upper surface of the selected substrate by physical vapor deposition (PVD), and furthermore, after the photoresist is coated on the first metal layer, the first metal layer is exposed by a photolithography process to form a desired pattern, and the bottom gate and the auxiliary electrode are formed by wet etching and photoresist stripping according to the desired pattern. The selected substrate can be made of any of quartz, glass or transparent plastic.

After preparing the bottom gate and the auxiliary electrode, a layer of silicon nitride is applied by a chemical vapor deposition (CVD) method to cover on the top surface of the selected substrate and the bottom gate and the auxiliary electrode formed thereon, and then a layer of silicon oxide is applied by chemical vapor deposition to cover on the silicon nitride layer to obtain the buffer layer of the laminated structure, i.e., the buffer layer is a laminated structure formed by a silicon nitride film layer and a silicon oxide film layer located above the silicon nitride film layer.

In step S2, the active layer is formed by applying a metal conductive oxide on the buffer layer by physical vapor deposition; it should be noted that the metal conductive oxide comprises indium gallium zinc oxide (IGZO) or other metal conductive oxide;

After applying a layer of photoresist on the active layer, the photoresist is exposed and developed by using a semi-transparent mask (such as a grayscale mask or a halftone mask), so that the photoresist is patterned as the desired photoresist pattern, such that the photoresist pattern has a stepped shape above the auxiliary electrode; using an etching gas (such as SF6, CI2, CF4, Ar and NF3), a dry etching process is performed on areas of the photoresist pattern that are not covered by the photoresist to form the first conductive hole penetrating the upper and lower surfaces of the active layer and the upper and lower surfaces of the buffer layer and connecting with the auxiliary electrode; a pattern reservation area of the active layer is determined, and the photoresist is dry etched by using oxidizing gas (such as O2 and N2O) to remove the photoresist corresponding to the area outside the pattern reservation area of the active layer; using an etching gas (such as SF6, CI2, CF4, Ar and NF3), a dry etching process is performed on the active layer of which the photoresist is removed except for the pattern reservation area to etch the area of the active layer except the pattern reservation area; and then the oxidizing gas (such as O2, N2O) is used to perform dry etching to the photoresist of the pattern reservation area of the active layer to remove the photoresist.

In step S3, a gate insulating layer is formed by applying a layer of silicon nitride on top of the active layer by CVD, and after applying a layer of photoresist on the gate insulating layer, the photoresist is exposed and developed by using a transparent mask, so that the photoresist is patterned into a photoresist pattern corresponding to the pattern reservation area of the gate insulating layer; the photoresist is dry etched by using oxidizing gas (such as O2 and N2O) to remove the photoresist corresponding to the area outside the pattern reservation area of the gate insulating layer; using an etching gas (such as SF6, CI2, CF4, Ar and NF3), a dry etching process is performed on the gate insulating layer of which the photoresist is removed except for the pattern reservation area to etch the area of the gate insulating layer except the pattern reservation area; and then the oxidizing gas (such as O2, N2O) is used to perform dry etching to the photoresist of the pattern reservation area of the gate insulating layer to remove the photoresist;

The second metal layer is formed by sputtering a layer of metal on the upper surface of the gate insulating layer by PVD, and furthermore, after the second metal layer is coated with photoresist, the second metal layer is exposed by a photolithography process to form a desired pattern, and the top gate is formed by wet etching and photoresist stripping according to the desired pattern, and moreover, a thick layer of silicon nitride is coated by CVD to cover the active layer, gate insulating layer and top gate as an middle dielectric layer;

In step S4, in the same manner as forming the first conductive hole in the active layer in step S2, the second conductive hole communicating with the first conductive hole is formed in the middle dielectric layer, and so are the third conductive hole and the fourth conductive hole; after forming all holes in the middle dielectric layer, a third metal layer is formed by sputtering a layer of metal on the surface of the middle dielectric layer by PVD, and the third metal layer is respectively connected to the active layer through the third conductive hole and the fourth conductive hole, and is connected to the auxiliary electrode through the first conductive hole and the second conductive hole;

After applying a layer of photoresist on the third metal layer, the photoresist is exposed and developed by using a semi-transparent mask (such as a grayscale mask or a halftone mask), so that the photoresist is patterned as the desired photoresist pattern, such that the photoresist pattern has a stepped shape above the second conductive hole, the third conductive hole and the fourth conductive hole; a wet etching process is performed by using a corrosive solution (such as PPC acid, ENF acid, oxalic acid, etc.) to respectively form the source corresponding to the third conductive hole, the drain corresponding to the fourth conductive hole, and a metal connection wire corresponding to the second conductive hole.

In step S5, an inorganic passivation layer is formed by applying a layer of silicon nitride by CVD to cover on the source, the drain and the metal connection wire, and then an organic planarization layer is formed by coating a layer of PMMA by CVD to cover on the inorganic passivation layer, and then the laminated structure formed by the inorganic passivation layer and the organic planarization layer;

In the same manner as forming the first conductive hole in the active layer in step S2, the fifth conductive hole penetrating the upper and lower surfaces of the organic flat layer and penetrating into the inorganic passivation layer and connecting with the source is formed in the organic planarization layer and the inorganic passivation layer, and the recessed hole connecting with the metal connection wire is formed; then the recessed hole should be etched in the direction away from the pixel electrode by 0.1 μm to 2 μm, so that the recessed hole forms the first cavity communicating with the second cavity; wherein the first cavity is disposed on the inorganic passivation layer, and the second cavity is disposed on the organic planarization layer, and the first cavity extends from the edge line of the second cavity away from the pixel electrode in the direction away from the pixel electrode;

In Step S6, a transparent electrode layer is formed by sputtering a layer of metal conductive oxide (such as ITO/Ag/ITO) by PVD on the surface of the organic flat layer, and the transparent electrode layer is patterned to respectively form the metal electrode and the pixel electrode; wherein the pixel electrode is electrically connected to the source through the fifth conductive hole; the metal connection electrode is electrically connected to the auxiliary electrode after connecting with the metal connection wire through the recessed hole;

In Step S7, a pixel definition layer is formed by applying a layer of silicon nitride by CVD to cover on the organic planarization layer, the metal connection electrode and the pixel electrode, and after applying a layer of photoresist on the pixel definition layer, the photoresist is exposed and developed by using a transparent mask, so that the photoresist is patterned into a photoresist pattern corresponding to the pattern reservation area of the pixel definition layer; the photoresist is dry etched by using oxidizing gas (such as O2 and N2O) to remove the photoresist corresponding to the area outside the pattern reservation area of the pixel definition layer; using an etching gas (such as SF6, CI2, CF4, Ar and NF3), a dry etching process is performed on the pixel definition layer of which the photoresist is removed except for the pattern reservation area to etch the area of the pixel definition layer except the pattern reservation area; and then the oxidizing gas (such as O2, N2O) is used to perform dry etching to the photoresist of the pattern reservation area of the pixel definition layer to remove the photoresist to provide the pixel definition layer with corresponding grooves to accommodate the metal connection electrode and the pixel electrode;

In Step S8, the OLED semiconductor layer is deposited by CVD on the pixel definition layer, the metal connection electrode and the pixel electrode and is extended into the recessed hole to connect with metal connection wire to achieve electrical connection of the OLED semiconductor layer with the auxiliary electrode, and meanwhile, due to the gap formed in the first cavity and the second cavity in the recessed hole, the OLED semiconductor layer is in a discontinuous connection state with the recessed hole as a breakpoint;

In Step S9, the cathode is formed by sputtering a layer of metal (such as Ag/Mg) on the upper surface of the OLED semiconductor layer by PVD, and the metal of the cathode is extended into the recessed hole to connect with the metal connection wire to achieve the electrical connection of the cathode with the auxiliary electrode to improve the conductivity of the cathode; meanwhile, due to the gap formed in the first cavity and the second cavity in the recessed hole, the cathode is in a discontinuous connection state with the recessed hole as a breakpoint to reduce the resistance of the cathode.

In summary, implementation of the embodiments of the present invention possess the following benefits: in the present invention, the cathode on the OLED semiconductor layer is made into a discontinuous connection state with the recessed hole formed in the array substrate, then, the resistance of the cathode is effectively reduced, and the cathode can be extended into the recessed hole to achieve the electrical connection with the auxiliary electrode. The conductivity of the cathode on the OLED semiconductor layer can be improved, and the purpose of reducing the voltage drop can be achieved. Meanwhile, the inverted trapezoidal legs in the prior art can be omitted to simplify the manufacturing process for saving time and effort.

Above are embodiments of the present invention, which do not limit the scope of the present invention. Any equivalent amendments within the spirit and principles of the embodiment described above should be covered by the protected scope of the invention.

What is claimed is:

1. An organic light emitting display device, comprising:
    an array substrate, comprising a pixel electrode and a metal connection electrode and an auxiliary electrode located around the pixel electrode, wherein the metal connection electrode is electrically connected to the auxiliary electrode through a recessed hole formed in the array substrate; the recessed hole is located above the auxiliary electrode and forms a first cavity and a second cavity communicating with each other, and the first cavity extends from an edge line of the second cavity away from the pixel electrode in a direction away from the pixel electrode;
    a pixel definition layer disposed on the array substrate; wherein the pixel definition layer is respectively provided with corresponding grooves above the recessed hole and the pixel electrode of the array substrate;
    an organic light emitting diode (OLED) semiconductor layer disposed on the array substrate and the pixel definition layer; wherein the OLED semiconductor layer further covers the pixel electrode and the metal connection electrode and extends into the first cavity of the recessed hole to achieve electrical connection with the auxiliary electrode; and
    a cathode disposed on the OLED semiconductor layer; wherein the cathode further extends into the first cavity of the recessed hole to achieve electrical connection with the auxiliary electrode and is in a discontinuous connection state with the recessed hole as a breakpoint.

2. The organic light emitting display device according to claim 1, wherein the array substrate is a dual gate structure thin film transistor array substrate, comprising:
    a substrate;
    a bottom gate and the auxiliary electrode disposed on the substrate;
    a buffer layer covering on the substrate, the bottom gate and the auxiliary electrode; wherein the buffer layer is provided with a first conductive hole penetrating an upper surface of the buffer layer and connecting with the auxiliary electrode;
    an active layer disposed on the buffer layer;
    a gate insulating layer disposed on the active layer;
    a top gate disposed on the gate insulating layer;
    a middle dielectric layer covering the active layer, the gate insulating layer, the top gate and the buffer layer; wherein the middle dielectric layer is provided with a second conductive hole penetrating upper and lower surfaces of the middle dielectric layer and communicating with the first conductive hole, and is provided with a third conductive hole and a fourth conductive hole penetrating the upper surface of the middle dielectric layer and respectively connecting with the active layer;
    a source, a drain and a metal connection wire in the middle dielectric layer; wherein the source is electrically connected to the active layer through the third conductive hole and the drain is electrically connected to the active layer through the fourth conductive hole; or the source is electrically connected to the active layer through the fourth conductive hole and the drain is electrically connected to the active layer through the third conductive hole; the metal connection wire is electrically connected to the auxiliary electrode through the second conductive hole and the first conductive hole in sequence;
    a planarization layer covering on the source, the drain and the metal connection wire; wherein the planarization layer is provided with a fifth conductive hole penetrating an upper surface of the planarization layer and connecting with the source or the drain, and is provided with the recessed hole connecting with the metal connection wire; and
    the pixel electrode, disposed on the planarization layer and electrically connected to the source or the drain through the fifth conductive hole, and the metal connection electrode, electrically connected to the auxiliary electrode after connecting with the metal connection wire through the recessed hole;
    wherein both the OLED semiconductor layer and the cathode are electrically connected with the auxiliary electrode after connecting with the metal connection wire through the recessed hole.

3. The organic light emitting display device according to claim 2, wherein the planarization layer is a single-layer structure made of an organic material; wherein the fifth conductive hole, and the first cavity and the second cavity of the recessed hole are all disposed in the planarization layer of the single-layer structure; or
    the planarization layer is a laminated layer structure formed by laminating an inorganic passivation layer made of an inorganic material and an organic planarization layer made of an organic material; wherein the fifth conductive hole penetrates upper and lower surfaces of the organic planarization layer and penetrates into the inorganic passivation layer, and the first cavity of the recessed hole is disposed in the inorganic passivation layer, and the second cavity of the recessed hole is in the organic planarization layer on the inorganic passivation layer.

4. The organic light emitting display device according to claim 3, wherein the inorganic material is one of SiOx, SiNx and SiNO; the organic material is polymethyl methacrylate (PMMA) or siloxane.

5. The organic light emitting display device according to claim 4, wherein the buffer layer is a single-layer structure made of one of SiOx, SiNx and SiNO; or a laminated structure made of SiNx/SiOx.

6. The organic light emitting display device according to claim 5, wherein the active layer is made of indium gallium zinc oxide (IGZO) or low temperature polysilicon (LTPS).

7. The organic light emitting display device according to claim 6, wherein both the pixel electrode and the auxiliary electrode is made of one of metal oxides of ITO/Ag/ITO, IZO/Ag/IZO and AZO/Ag/AZO.

8. An organic light emitting display device, comprising:
an array substrate, comprising a pixel electrode and a metal connection electrode and an auxiliary electrode located around the pixel electrode, wherein the metal connection electrode is electrically connected to the auxiliary electrode through a recessed hole formed in the array substrate; the recessed hole is located above the auxiliary electrode and forms a first cavity and a second cavity communicating with each other, and the first cavity extends from an edge line of the second cavity away from the pixel electrode in a direction away from the pixel electrode;
a pixel definition layer disposed on the array substrate; wherein the pixel definition layer is respectively provided with corresponding grooves above the recessed hole and the pixel electrode of the array substrate;
an organic light emitting diode (OLED) semiconductor layer disposed on the array substrate and the pixel definition layer; wherein the OLED semiconductor layer further covers the pixel electrode and the metal connection electrode and extends into the first cavity of the recessed hole to achieve electrical connection with the auxiliary electrode; and
a cathode disposed on the OLED semiconductor layer; wherein the cathode further extends into the first cavity of the recessed hole to achieve electrical connection with the auxiliary electrode and is in a discontinuous connection state with the recessed hole as a breakpoint;
wherein the array substrate is a top gate structure thin film transistor array substrate, comprising:
a substrate;
a light blocking layer and the auxiliary electrode disposed on the substrate;
a buffer layer covering on the substrate, the light blocking layer and the auxiliary electrode; wherein the buffer layer is provided with a first conductive hole penetrating an upper surface of the buffer layer and connecting with the auxiliary electrode;
an active layer disposed on the buffer layer;
a gate insulating layer disposed on the active layer;
a top gate disposed on the gate insulating layer;
a middle dielectric layer covering the active layer, the gate insulating layer, the top gate and the buffer layer; wherein the middle dielectric layer is provided with a second conductive hole penetrating upper and lower surfaces of the middle dielectric layer and communicating with the first conductive hole, and is provided with a third conductive hole and a fourth conductive hole penetrating the upper surface of the middle dielectric layer and respectively connecting with the active layer;
a source, a drain and a metal connection wire in the middle dielectric layer; wherein the source is electrically connected to the active layer through the third conductive hole and the drain is electrically connected to the active layer through the fourth conductive hole; or the source is electrically connected to the active layer through the fourth conductive hole and the drain is electrically connected to the active layer through the third conductive hole; the metal connection wire is electrically connected to the auxiliary electrode through the second conductive hole and the first conductive hole in sequence;
a planarization layer covering on the source, the drain and the metal connection wire; wherein the planarization layer is provided with a fifth conductive hole penetrating an upper surface of the planarization layer and connecting with the source or the drain, and is provided with the recessed hole connecting with the metal connection wire; and
the pixel electrode, disposed on the planarization layer and electrically connected to the source or the drain through the fifth conductive hole, and the metal connection electrode, electrically connected to the auxiliary electrode after connecting with the metal connection wire through the recessed hole;
wherein both the OLED semiconductor layer and the cathode are electrically connected with the auxiliary electrode after connecting with the metal connection wire through the recessed hole.

9. The organic light emitting display device according to claim 8, wherein the planarization layer is a single-layer structure made of an organic material; wherein the fifth conductive hole, and the first cavity and the second cavity of the recessed hole are all disposed in the planarization layer of the single-layer structure; or
the planarization layer is a laminated layer structure formed by laminating an inorganic passivation layer made of an inorganic material and an organic planarization layer made of an organic material; wherein the fifth conductive hole penetrates upper and lower surfaces of the organic planarization layer and penetrates into the inorganic passivation layer, and the first cavity of the recessed hole is disposed in the inorganic passivation layer, and the second cavity of the recessed hole is in the organic planarization layer on the inorganic passivation layer.

10. The organic light emitting display device according to claim 9, wherein the inorganic material is one of SiOx, SiNx and SiNO; the organic material is polymethyl methacrylate (PMMA) or siloxane.

11. The organic light emitting display device according to claim 10, wherein the buffer layer is a single-layer structure made of one of SiOx, SiNx and SiNO; or a laminated structure made of SiNx/SiOx.

12. The organic light emitting display device according to claim 11, wherein the active layer is made of indium gallium zinc oxide (IGZO) or low temperature polysilicon (LTPS).

13. The organic light emitting display device according to claim 12, wherein both the pixel electrode and the auxiliary electrode is made of one of metal oxides of ITO/Ag/ITO, IZO/Ag/IZO and AZO/Ag/AZO.

14. An organic light emitting display device, comprising:
an array substrate, comprising a pixel electrode and a metal connection electrode and an auxiliary electrode located around the pixel electrode, wherein the metal connection electrode is electrically connected to the auxiliary electrode through a recessed hole formed in the array substrate; the recessed hole is located above the auxiliary electrode and forms a first cavity and a second cavity communicating with each other, and the first cavity extends from an edge line of the second cavity away from the pixel electrode in a direction away from the pixel electrode;

a pixel definition layer disposed on the array substrate; wherein the pixel definition layer is respectively provided with corresponding grooves above the recessed hole and the pixel electrode of the array substrate;

an organic light emitting diode (OLED) semiconductor layer disposed on the array substrate and the pixel definition layer; wherein the OLED semiconductor layer further covers the pixel electrode and the metal connection electrode and extends into the first cavity of the recessed hole to achieve electrical connection with the auxiliary electrode; and a cathode disposed on the OLED semiconductor layer; wherein the cathode further extends into the first cavity of the recessed hole to achieve electrical connection with the auxiliary electrode and is in a discontinuous connection state with the recessed hole as a breakpoint;

wherein the array substrate is a bottom gate structure thin film transistor array substrate, comprising:

a substrate;

a bottom gate and the auxiliary electrode disposed on the substrate;

a buffer layer covering on the substrate, the bottom gate and the auxiliary electrode; wherein the buffer layer is provided with a first conductive hole penetrating an upper surface of the buffer layer and connecting with the auxiliary electrode;

an active layer disposed on the buffer layer;

a middle dielectric layer covering the active layer and the buffer layer; wherein the middle dielectric layer is provided with a second conductive hole penetrating upper and lower surfaces of the middle dielectric layer and communicating with the first conductive hole, and is provided with a third conductive hole and a fourth conductive hole penetrating the upper surface of the middle dielectric layer and respectively connecting with the active layer;

a source, a drain and a metal connection wire in the middle dielectric layer; wherein the source is electrically connected to the active layer through the third conductive hole and the drain is electrically connected to the active layer through the fourth conductive hole; or the source is electrically connected to the active layer through the fourth conductive hole and the drain is electrically connected to the active layer through the third conductive hole; the metal connection wire is electrically connected to the auxiliary electrode through the second conductive hole and the first conductive hole in sequence;

a planarization layer covering on the source, the drain and the metal connection wire; wherein the planarization layer is provided with a fifth conductive hole penetrating an upper surface of the planarization layer and connecting with the source or the drain, and is provided with the recessed hole connecting with the metal connection wire; and the pixel electrode, disposed on the planarization layer and electrically connected to the source or the drain through the fifth conductive hole, and the metal connection electrode, electrically connected to the auxiliary electrode after connecting with the metal connection wire through the recessed hole;

wherein both the OLED semiconductor layer and the cathode are electrically connected with the auxiliary electrode after connecting with the metal connection wire through the recessed hole.

15. The organic light emitting display device according to claim 14, wherein the planarization layer is a single-layer structure made of an organic material; wherein the fifth conductive hole, and the first cavity and the second cavity of the recessed hole are all disposed in the planarization layer of the single-layer structure; or the planarization layer is a laminated layer structure formed by laminating an inorganic passivation layer made of an inorganic material and an organic planarization layer made of an organic material; wherein the fifth conductive hole penetrates upper and lower surfaces of the organic planarization layer and penetrates into the inorganic passivation layer, and the first cavity of the recessed hole is disposed in the inorganic passivation layer, and the second cavity of the recessed hole is in the organic planarization layer on the inorganic passivation layer.

16. The organic light emitting display device according to claim 15, wherein the inorganic material is one of SiOx, SiNx and SiNO; the organic material is polymethyl methacrylate (PMMA) or siloxane.

17. The organic light emitting display device according to claim 16, wherein the buffer layer is a single-layer structure made of one of SiOx, SiNx and SiNO; or a laminated structure made of SiNx/SiOx.

18. The organic light emitting display device according to claim 17, wherein the active layer is made of indium gallium zinc oxide (IGZO) or low temperature polysilicon (LTPS).

19. The organic light emitting display device according to claim 18, wherein both the pixel electrode and the auxiliary electrode is made of one of metal oxides of ITO/Ag/ITO, IZO/Ag/IZO and AZO/Ag/AZO.

* * * * *